United States Patent
Rao et al.

(10) Patent No.: US 9,686,762 B2
(45) Date of Patent: Jun. 20, 2017

(54) METHOD AND SYSTEM FOR MULTIPLEXING LOW FREQUENCY CLOCKS TO REDUCE INTERFACE COUNT

(75) Inventors: Srinivas Rao, Bangalore (IN); Gajendra Singh Ranka, Bangalore (IN)

(73) Assignee: TEJAS NETWORKS LTD, Bangalore (IN)

( * ) Notice: Subject to any disclaimer, the term of this patent is extended or adjusted under 35 U.S.C. 154(b) by 2 days.

(21) Appl. No.: 14/008,555

(22) PCT Filed: Jul. 8, 2011

(86) PCT No.: PCT/IB2011/053040
§ 371 (c)(1),
(2), (4) Date: Sep. 29, 2013

(87) PCT Pub. No.: WO2012/131448
PCT Pub. Date: Oct. 4, 2012

(65) Prior Publication Data
US 2014/0044119 A1 Feb. 13, 2014

(30) Foreign Application Priority Data
Mar. 30, 2011 (IN) ............ 1029/CHE/2011

(51) Int. Cl.
*H04W 56/00* (2009.01)
*H03K 5/15* (2006.01)

(52) U.S. Cl.
CPC ......... *H04W 56/0015* (2013.01); *H03K 5/15* (2013.01)

(58) Field of Classification Search
None
See application file for complete search history.

(56) References Cited

U.S. PATENT DOCUMENTS

| 4,873,684 | A | * | 10/1989 | Kobayashi et al. .......... 370/506 |
|---|---|---|---|---|
| 5,321,728 | A | * | 6/1994 | Andrieu ....................... 375/354 |
| 5,987,010 | A | | 11/1999 | Schnizlein |
| 6,194,969 | B1 | * | 2/2001 | Doblar ............................ 331/2 |
| 6,754,171 | B1 | * | 6/2004 | Bernier ................. H04J 3/0688 370/216 |
| 6,888,826 | B1 | * | 5/2005 | Martin et al. ................. 370/359 |
| 7,555,048 | B1 | | 6/2009 | Massoumi et al. |
| 2003/0214977 | A1 | | 11/2003 | Kuo |

(Continued)

*Primary Examiner* — Shaq Taha
*Assistant Examiner* — Ronald H Davis
(74) *Attorney, Agent, or Firm* — Deborah A. Gador

(57) ABSTRACT

Embodiments of the present disclosure relate to a method and system for multiplexing the low frequency signals from at least one clock transmitter to at least one clock receiver to reduce interface count. The low frequency signals are multiplexed in a CLKMUX logic using selection signals. The selection signals are generated using system frame and system clocks. The multiplexed clock is received by the CLKDEMUX logic through an interface. The interface can be backplane connectors, PCB traces and cables. The CLKDEMUX logic de-multiplexes the received clock and transmits to the SELECT LOGIC for selecting at least one low frequency clock. The SELECT LOGIC selects at least one low frequency clock based on the signals from a processor. The jitter attenuator filters jitter in the low frequency clock and the CLOCK SINK distributes system clocks to rest of system elements.

10 Claims, 4 Drawing Sheets

(56) References Cited

U.S. PATENT DOCUMENTS

2007/0019766 A1* 1/2007 Bereza ............... H03K 19/1774
  375/354
2008/0025346 A1* 1/2008 Takahashi et al. ........... 370/503
2013/0039369 A1* 2/2013 Forsberg ....................... 370/510

* cited by examiner

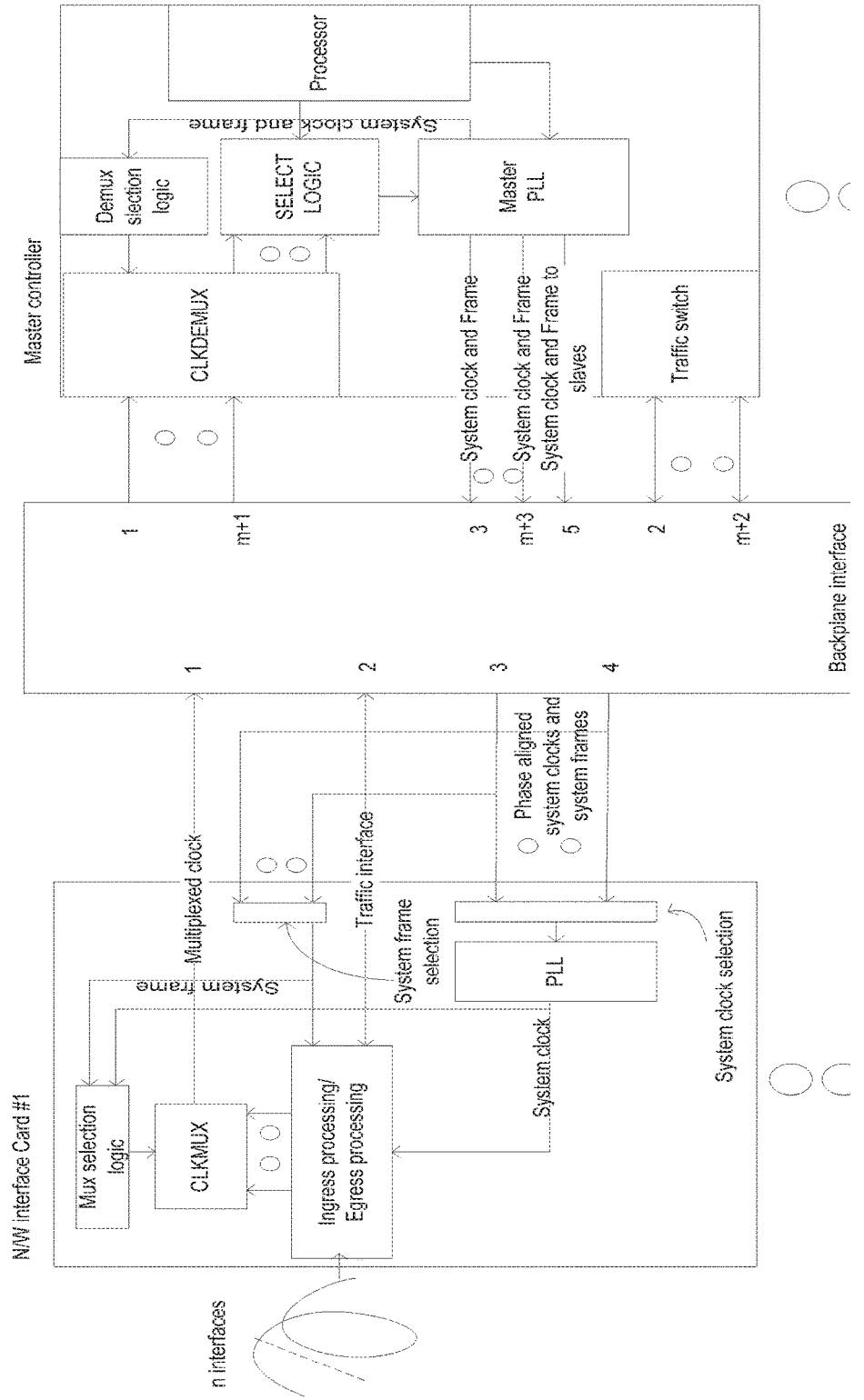
Fig. 2-A

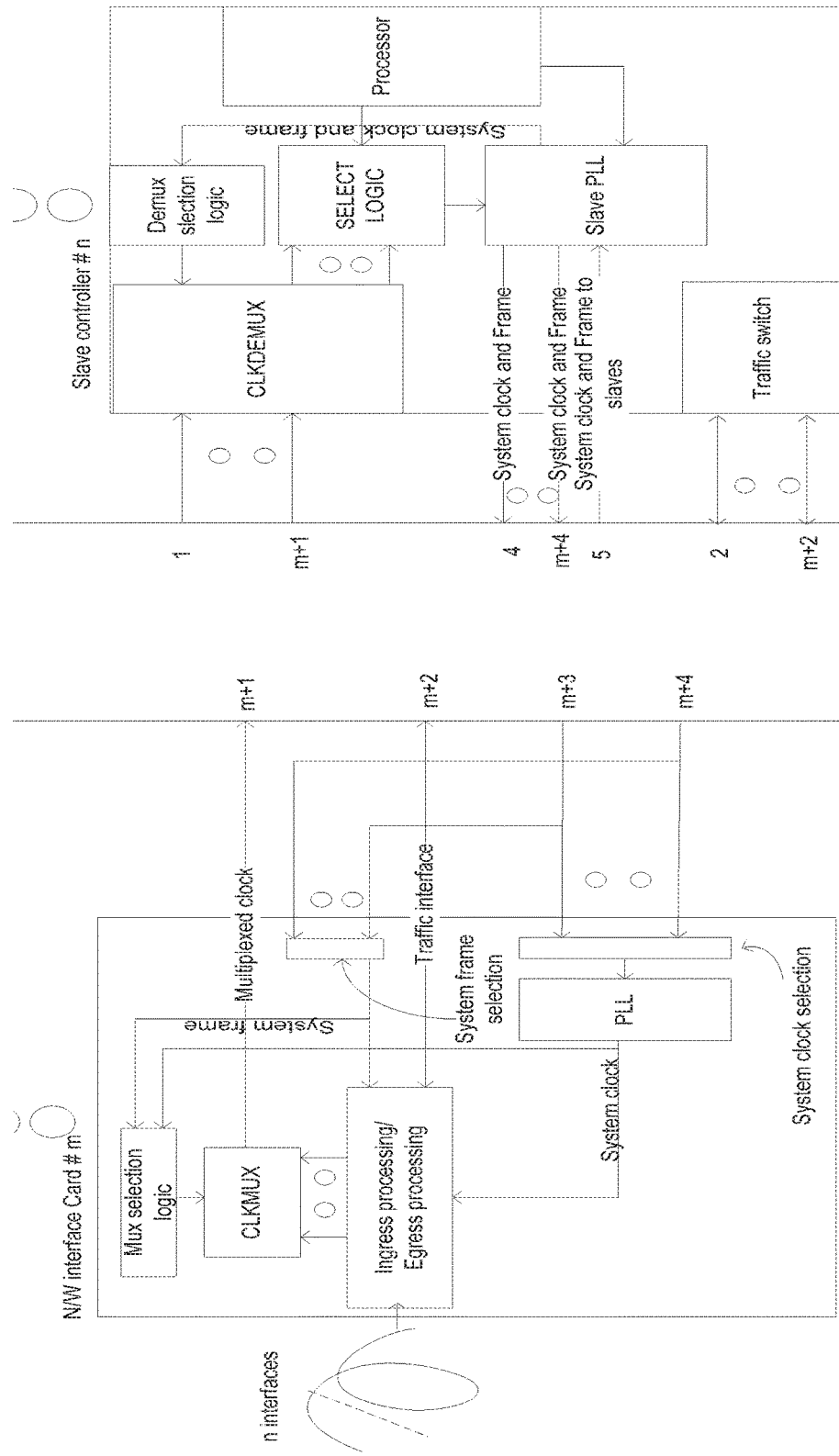
FIG. 2-B

METHOD AND SYSTEM FOR MULTIPLEXING LOW FREQUENCY CLOCKS TO REDUCE INTERFACE COUNT

CROSS-REFERENCE TO RELATED APPLICATION

The present application claims priority to Indian patent application serial number 1029/CHE/2011 filed on Mar. 30, 2011, and claims the benefit of international application PCT/IB2011/053040 filed Jul. 8, 2011, the entire contents of which are incorporated by reference.

TECHNICAL FIELD

The present disclosure relates to the field of networks. More particularly, the embodiments of the disclosure relates to a method and system for multiplexing low frequency clocks to reduce interface count.

BACKGROUND OF THE DISCLOSURE

Many telecommunication switching systems might include plurality of I/O Cards (called line cards or network interface cards) for processing different data from network interfaces like E1, DS1, STM-n, OC-n etc and send this processed data to traffic switch (Called Switch card) to switch data from one network interface to other. In such telecommunication systems the data from line cards to switch card passes over a backplane which connects various cards in a system. Such telecommunication system is called network element. In a network there is plurality of such network elements. In networks like SONET/SDH, all these network elements need to work in locked mode traceable to PRC (Primary Reference Clock). The synchronization from one network element to other is passed over various interfaces like E1, DS1, STM-n, OC-n etc.

Each network interface card extracts synchronization clocks from various network interfaces and sends them to at least one system synchronizer. These clocks are typically of order of few KHz. The system synchronizer monitors subset of these clock and selects one among them based on user defined priority and quality of the clocks. Thus system synchronizer, synchronize the network element so that the entire outgoing interfaces from the said network element are in sync.

Further in order to avoid single point of failure, it is well know method in the telecommunication systems to replicate critical sub systems like power supply, switch card, network element controller, system synchronizer etc. Further, the critical subsystems like traffic switch, system synchronizer and chassis controller are integrated into single card called controller. Such cards are replicated, one controller acting as master and one or more acting as slave controllers.

Further as the number of network interface cards increases, the number of clock that has to be passed to master and slave controllers increases. This increases the backplane interface connections making the controller and backplane design complex.

Therefore, there is a need to develop system architecture and a method to achieve effective way to pass various low frequency clocks from network interface cards to controller cards using reduced interface count

SUMMARY OF THE DISCLOSURE

This section provides a general summary of the disclosure, and is not a comprehensive disclosure of its full scope or all of its features.

Additional features and advantages are realized through the techniques of the present disclosure. Other embodiments and aspects of the disclosure are described in detail herein and are considered a part of the claimed disclosure.

In one embodiment, the present disclosure provides a method of multiplexing low frequency clocks from at least one clock transmitter to at least one clock receiver to reduce interface count. The clock transmitter comprises of CLK-MUX logic, Mux selection logic and CLOCK SOURCE. The clock receiver comprises of CLKDEMUX logic, SELECT LOGIC, Demux Selection Logic, jitter attenuator, processor logic and CLOCK SINK. The low frequency signals from the CLOCK SOURCE logic are sent to the CLKMUX logic. The selection signals are generated in the Mux selection logic using system frame and system clock signals, wherein the Mux selection logic is coupled to the CLKMUX logic. The low frequency clocks are multiplexed in the CLKMUX logic using the selection signals. The multiplexed clocks are transmitted to the CLKDEMUX logic using an interface. The multiplexed clocks are de-multiplexed in the CLKDEMUX logic and these clocks are received by the SELECT LOGIC for selecting at least one low frequency signal. The jitter caused in the low frequency clock is filtered by jitter attenuator and CLOCK SINK distributes system clocks and system frames to other devices of network element.

In one embodiment, the low frequency clocks are in the range of 2 kHz, 4 kHz, 8 kHz, and 16 kHz.

In one embodiment, the interface is selected from a group comprising backplane connectors, PCB traces and cables.

In one embodiment, the SELECT LOGIC selects the low frequency clock based on the signal from a processor which is coupled to the SELECT LOGIC.

In one embodiment, the CLOCK SINK provides system frame and system clock using which the low frequency clocks are multiplexed and hence ratio of the low frequency clock to the frequency of the system clock signals is based on jitter attenuator characteristics.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The novel features and characteristic of the disclosure are set forth in the appended claims. The embodiments of the disclosure itself, however, as well as a preferred mode of use, further objectives and advantages thereof, will best be understood by reference to the following detailed description of an illustrative embodiment when read in conjunction with the accompanying drawings. One or more embodiments are now described, by way of example only, with reference to the accompanying drawings.

FIG. 2 is a block diagram of network element in accordance with one embodiment of the present disclosure.

The figures depict embodiments of the disclosure for purposes of illustration only. One skilled in the art will readily recognize from the following description that alternative embodiments of the structures and methods illustrated herein may be employed without departing from the principles of the disclosure described herein.

DETAILED DESCRIPTION

The foregoing has broadly outlined the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

Embodiments of the present disclosure relate to a method and system for multiplexing low frequency clocks from at least one clock transmitter to at least one clock receiver to reduce interface count.

Figure 1:
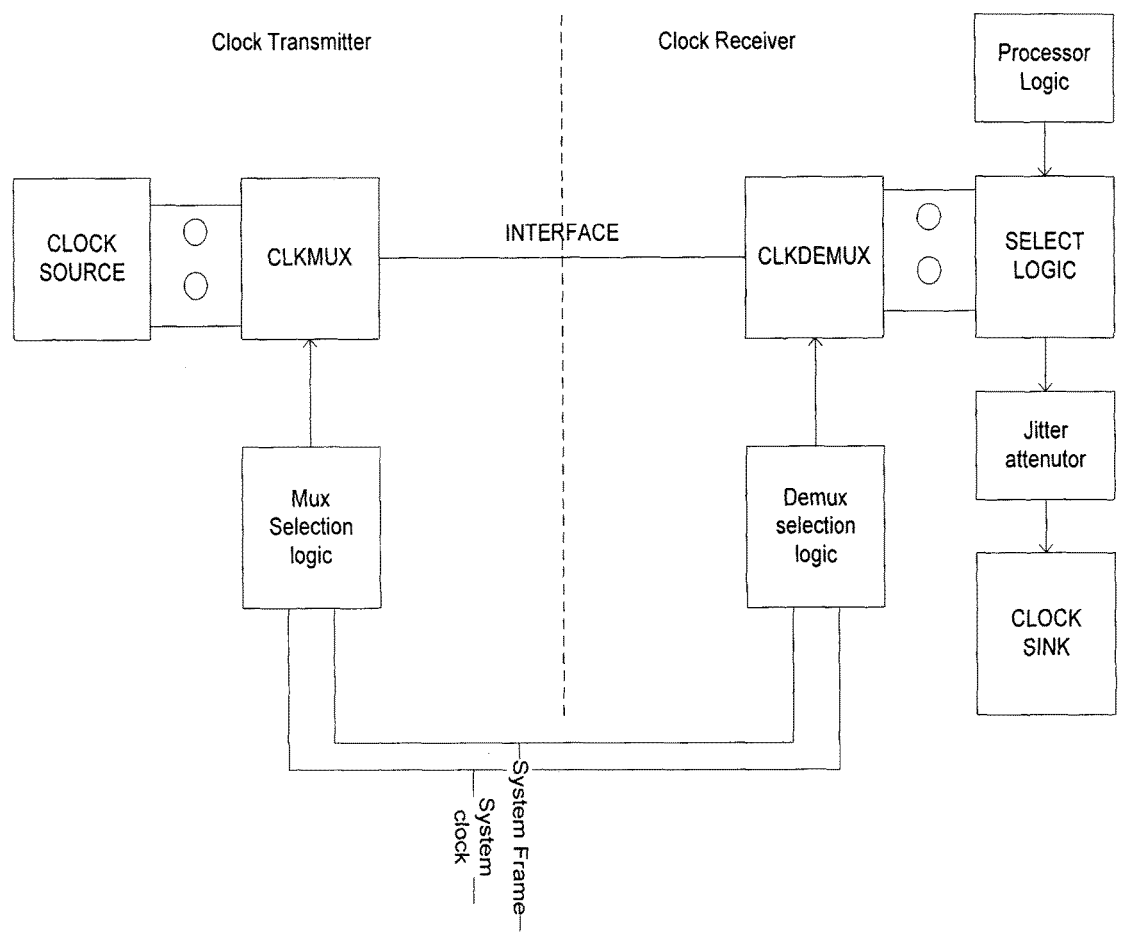
FIG. 1 illustrates a block diagram showing interconnections between clock transmitter and clock receiver on an interface in accordance with the present disclosure.

Referring now to FIG. 1, illustrates multiplexing the low frequency clocks from at least one clock transmitter to at least one clock receiver to reduce interface count.

The clock transmitter comprises of CLKMUX logic, Mux Selection Logic and CLOCK SOURCE. The clock receiver comprises of CLKDEMUX logic, Demux Selection Logic, SELECT LOGIC, jitter attenuator, processor and CLOCK SINK. In an embodiment, the clock transmitter can be network interface cards and the clock receiver can be master controllers and slave controllers.

The low frequency clocks from the clock transmitter are sent to the CLKMUX logic. The low frequency clocks are in the range of 2 kHz, 4 kHz, 8 kHz, and 16 kHz. The CLKMUX logic multiplexes the low frequency clocks using selection signals. The selection signals are generated in the MUX Selection Logic using system frame and system clocks which is coupled to the CLKMUX logic. The system frame and system clocks are provided by the CLK SINK. The multiplexed clock passes over an interface and arrives at the CLKDEMUX logic. The interface is selected from a group comprising backplane connectors, PCB traces and cables. The CLKDEMUX logic separates the individual clocks by de-multiplexing and routes the clocks to the SELECT LOGIC. The SELECT LOGIC selects at least one of the recovered clocks based on the signals from the processor. The jitter attenuator filters the jitter in the low frequency clock and sends it to CLOCK SINK. CLOCK SINK distribute system clock and system frame to various devices in the network element.

FIG. 2 illustrates a block diagram of network elements in accordance with one embodiment of the present disclosure.

The system architecture comprises of plurality of network interface cards as a clock transmitter and a plurality of master and slave controllers as a clock receiver for managing the network interface cards. The network interface cards comprises of a CLKMUX logic, Mux Selection Logic, and ingress processing/egress processing logic. The master and slave controllers comprises of CLKDEMUX logic, SELECT LOGIC, Traffic switch, Demux selection logic and processor. The system architecture further comprises of a Phase Locked Loop (PLL) housed in the network interface cards, master and slave controllers for clock distribution. The network interface cards and master and slave controllers are connected to a backplane interface.

As shown in FIG. 2, m number of network interface cards are connected to at least one master controller and n number of slave controllers. The network interface cards consist of ingress/egress processor to recover the clock and data which is received over various network interfaces. The samples of these recovered clocks are mapped into time slots with respect to the system clock and system frame as shown in FIG. 3 and then sent to the controller for processing.

The master controller receives the low frequency clock from all the network interface cards and selects at least one clock among these available clocks based on user defined priority and clock quality monitoring. The selected reference clock is given to master PLL. The Master and slave PLL acts as jitter attenuator and CLOCK SINK. The master PLL distribute the clock to various devices in the network element like traffic switch, network interface cards.

Figure 3:
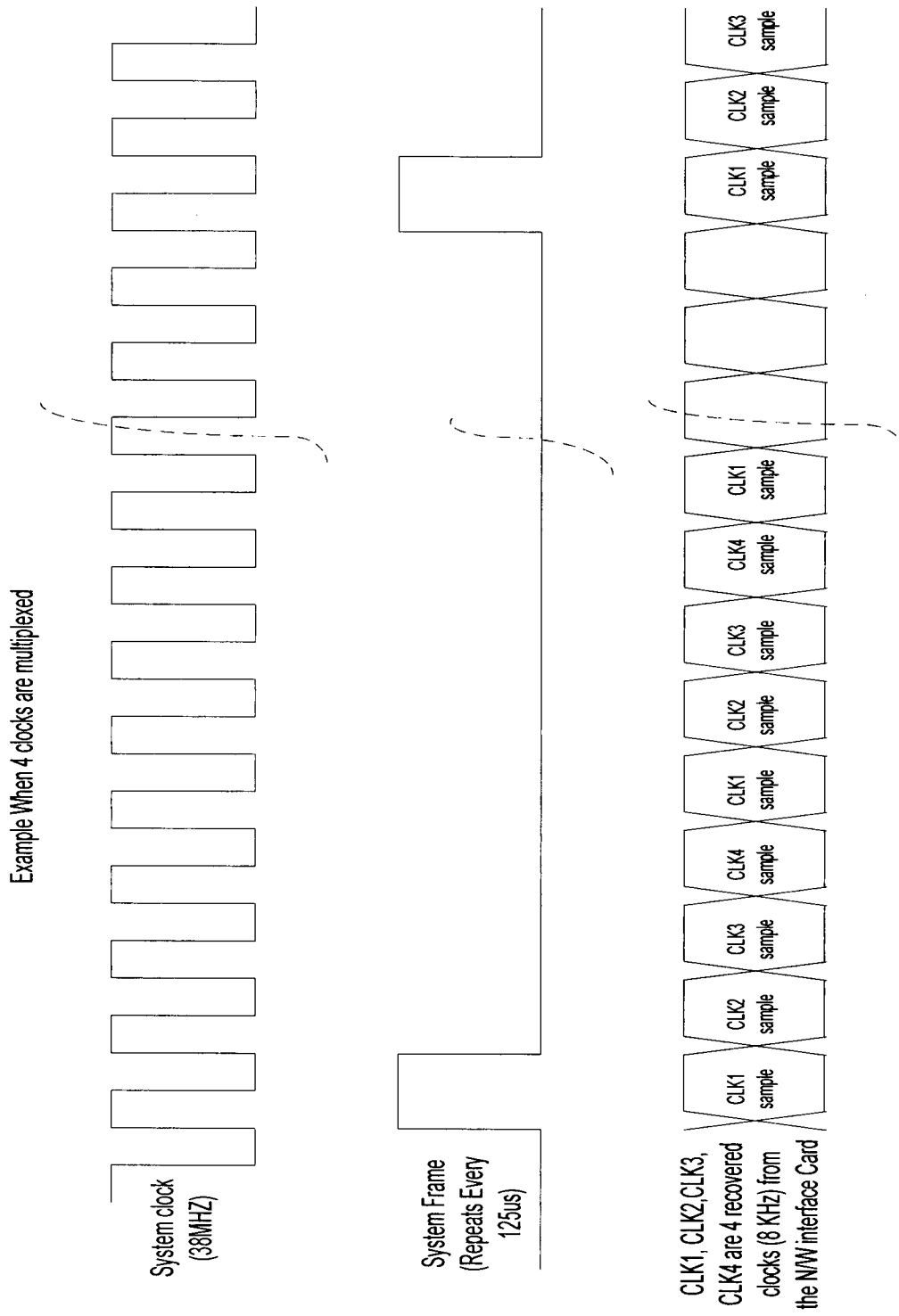
FIG. 3 shows mapping samples of low frequency clocks in different time slots in accordance with one embodiment of the present disclosure.

Referring now to FIG. 3, illustrates mapping samples of low frequency clocks in different time slots in accordance with the present disclosure. Master PLL distributes system clock and system frame to network interface cards and slave controllers. FIG. 3 shows mapping the recovered clocks (CLK1-CLK4) from one of the network interface cards. The sample of CLK1 is sent in the first clock period coinciding with system frame pulse, the sample of CLK2, CLK3, CLK4 are sent in the next 3 clock periods. This sequence of mapping samples of CLK1 to CLK4 is repeated. The system frame repeats for every 125 us and width is one clock pulse.

For example, consider a case where there are two controller cards, 12 interface cards and 4 recovered clocks running between each of the line card to each of the controller card. This makes 192 pins requirement in the backplane (Pins requirement at Line interfaces+controller interfaces) and 48 pins requirement at controller card backplane interface. Using the method of the present disclosure, the interface count is reduced to 48 in the backplane and 12 at the controller.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and devices within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In addition, where features or aspects of the disclosure are described in terms of Markush groups, those skilled in the art will recognize that the disclosure is also thereby described in terms of any individual member or subgroup of members of the Markush group.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of multiplexing low frequency clocks from at least one clock transmitter to at least one clock receiver to reduce interface count, said method comprising acts of:
    receiving the low frequency clocks from the at least one clock transmitter;
    generating a system frame signal from a system clock signal;
    mapping the low frequency clocks with the system frame signal by transmitting a first low frequency clock of the low frequency clocks in a first clock period coinciding with the system frame signal and subsequent low frequency clocks in corresponding subsequent clock periods;
    repeating the mapping of the low frequency clocks with the system frame signal after a predetermined time interval, wherein width of the system frame signal is one clock pulse;
    sending the low frequency clocks to a CLKMUX logic;
    generating selection signals, using said system frame and system clock signals, in a Mux selection logic, coupled to the CLKMUX logic, and sending the selection signals to the CLKMUX logic;
    multiplexing the low frequency clocks in the CLKMUX logic using the selection signals;
    transmitting the multiplexed clocks to a CLKDEMUX logic using an interface having a reduced interface count;
    de-multiplexing the clocks in the CLKDEMUX logic using said selection signals;
    sending the de-multiplexed clocks to a SELECT LOGIC for selecting at least one low frequency clock;
    filtering jitter caused in the low frequency clock; and
    distributing filtered clock by CLKSINK logic to various devices in the network element.

2. The method as claimed in claim 1, wherein the clock receiver and the clock transmitter are selected from a group comprising network interface card, and controller.

3. The method as claimed in claim 1, wherein the interfaces are selected from a group comprising backplane connectors, PCB traces and cables, and controller card/backplane interface.

4. The method as claimed in claim 1, wherein the system frame signal and the system clocks are provided by the CLKSINK logic.

5. The method as claimed in claim 1, wherein selection of the at least one low frequency clock is based on at least one of user defined priority and clock quality monitoring.

6. A system for multiplexing low frequency clocks from at least one clock transmitter to at least one clock receiver to reduce interface count comprising:
    a CLKSOURCE logic for producing the low frequency clocks;
    a system frame signal generated form a system clock signal;
    a clock signal mapping logic to map the low frequency clocks with the system frame signal by transmitting a first low frequency clock of the low frequency clocks in a first clock period coinciding with the system frame signal and subsequent low frequency clocks in corresponding subsequent clock periods and to repeat the mapping of the low frequency clocks with the system frame signal after a predetermined time interval, wherein width of the system frame signal is one clock pulse;
    a CLKMUX logic for multiplexing the low frequency clocks using selection signals generated using said system frame and system clock signals;
    a Mux Selection Logic coupled to the CLKMUX logic for generating the selection signals;
    an interface having a reduced interface count for carrying the multiplexed clock to a CLKDEMUX logic; wherein the CLKDEMUX logic de-multiplexes the multiplexed clock using said selection signals;
    a SELECT LOGIC for selecting at least one low frequency clock from the de-multiplexed clock based on the signals from a processor;
    a jitter attenuator for filtering jitter in the low frequency clock;
    a CLKSINK logic to distribute system clock for various devices in the network element; and
    the system operative to reduce interface count.

7. The system as claimed in claim 6, wherein the clock receiver and the clock transmitter are selected from a group comprising network interface card, and controller.

8. The system as claimed in claim 6, wherein the interfaces are selected from a group comprising backplane connectors, PCB traces and cables, and controller card/backplane interface.

9. The system as claimed in claim 6, wherein the SELECT LOGIC selects the low frequency clock based on the signal from a processor which is coupled to the SELECT LOGIC.

10. The system as claimed in claim 6, wherein the ratio of the low frequency clock to the frequency of the system clock signals is based on the jitter attenuator characteristics.

* * * * *